(12) United States Patent
Jeong

(10) Patent No.: US 6,909,640 B2
(45) Date of Patent: Jun. 21, 2005

(54) BLOCK SELECT CIRCUIT IN A FLASH MEMORY DEVICE

(75) Inventor: Jong Bae Jeong, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 176 days.

(21) Appl. No.: 10/464,666

(22) Filed: Jun. 19, 2003

(65) Prior Publication Data

US 2004/0156237 A1 Aug. 12, 2004

(30) Foreign Application Priority Data

Jul. 15, 2002 (KR) .................... 10-2002-0041315

(51) Int. Cl.$^7$ .............................................. G11C 11/34
(52) U.S. Cl. ............................. 365/185.33; 365/185.27
(58) Field of Search ........................ 365/185.33, 185.27

(56) References Cited

U.S. PATENT DOCUMENTS 6,597,603 B2 * 7/2003 Lambrache et al. ... 365/185.18

* cited by examiner

Primary Examiner—Michael T. Tran
(74) Attorney, Agent, or Firm—Mayer, Brown, Rowe & Maw LLP

(57) ABSTRACT

Disclosed is a block select circuit in a flash memory device. The block select circuit comprises a select unit including a flash memory cell that is programmable and erasable by a given voltage condition, for outputting a block select signal depending on address signals and a state of the flash memory cell, a high-voltage pumping unit for outputting a signal to keep a given high voltage according to the block select signal and the clock signal, and a switching unit for applying a given bias to a gate select line, a word line and a source select line of a flash memory cell block according to the output signal of the high-voltage pumping unit. A given voltage is not applied to a fail block by only the operation of programming the flash memory cell of an erase state. Therefore, it is possible to process a fail block even after being packaged.

8 Claims, 2 Drawing Sheets

BLOCK SELECT CIRCUIT IN A FLASH MEMORY DEVICE

BACKGROUND OF THE INVENTION

1. Field of the Invention

The present invention relates to a block select circuit in a flash memory device, and more particularly, to a select circuit in a flash memory device which enables a fail block to be processed even after being packaging by means of only an operation of programming the flash memory cell of an erase state so that a given voltage is not applied to the fail blocks.

2. Background of the Related Art

FIG. 1 is a block select circuit in a conventional NAND type flash memory device.

The block select circuit includes a select unit 11 for outputting a block select signal B_Sel according to an address signal and a select signal SEL, a high-voltage pumping unit 12 for outputting a signal to keep a given high voltage according to the output signal of the select unit 11 and a clock signal, and a switching unit 13 for applying a given bias to a gate select line GSL, a word line WL and a source select line SSL of a flash memory cell block 14 according to the output signal of the high-voltage pumping unit 12.

First, the construction of the select unit 11 will be described. A first NAND gate 101 logically combines 0~seventh address signals inputted from a first address input terminal ADx[0:7], eighth~fifteenth address signals inputted from a second address input terminal ADx[8:15], and sixteenth twenty-third address signals inputted from a third address input terminal ADx[16:23]. A fuse F11 is connected between the output terminal of the first NAND gate 101 and a first node Q11. A first PMOS transistor P11 having a gate terminal connected to the ground terminal Vss is connected between the power supply terminal Vcc and the first node Q11. A NOR gate 102 logically combines the potential of the first node Q11 and the select signal SEL to output a block select signal B_Sel.

Next, the construction of the high-voltage pumping unit 12 will be described. A second NAND gate 103 logically combines the clock signal Clk and the output signal of the NOR gate 102. A first NMOS transistor N11 driven by the power supply voltage Vcc is connected between the output terminal of the NOR gate 102 and a second node Q12. A first capacitor C11 that is charged according to the output of the first inverter I11 for inverting the output signal of the second NAND gate 103 is connected between the output terminal of the second NAND gate 103 and the second node Q12. A second NMOS transistor N12 driven according to the potential of the second node Q12 is connected between the second node Q12 and a pumping terminal Vpp. A fourth NMOS transistor N14 driven by the potential of the second node Q12 is connected between the pumping terminal Vpp and a third node Q13. A second capacitor C12 is connected between the output terminal of the second NAND gate 103 and the third node Q13. A third NMOS transistor N13 is connected between the third node Q13 and the second node Q13.

The construction of the switching unit 13 will be now described. A fifth NMOS transistor N15 supplies a given voltage V_GSL to the gate select line GSL of the flash memory cell block 14 according to the output signal of the high-voltage pumping unit 12. A sixth NMOS transistor N16 supplies a given voltage V_WL to the word line WL of the flash memory cell block 14 according to the output signal of the high-voltage pumping unit 12. Furthermore, a seventh NMOS transistor N17 supplies a given voltage V_SSL to the source select line SSL of the flash memory cell block 14 according to the output signal of the high-voltage pumping unit 12. Meanwhile, an eighth NMOS transistor N18 is driven according to the block select signal B_Sel that is inverted through a second inverter I12 to apply a given voltage V_GSL' to the gate select line GSL of the flash memory cell block 14 that is not selected.

A method of driving the conventional block select circuit in the flash memory device constructed above will be now described.

If a block is not selected, the address signals inputted through the first~third address input terminals ADx are applied with a Low state. The first NAND gate 101 then logically combines those signals to output a signal of a High state. The output signal of the first NAND gate 101 that is kept as the High state is applied to the first node Q11 via the fuse F11, so that the first node Q11 keeps the High state. As the potential of the first node Q11 that keeps the High state and the select signal SEL applied as the High state because the block are not selected, the NOR gate 102 logically combines the potential of the first node Q11 and the select signal SEL to output the block select signal B_Sel of a Low state. Meanwhile, if a block is selected, the address signals inputted through the first~third address input terminals ADx are applied as a High state. The first NAND gate 101 then logically combines those signals to output a signal of a Low state. Therefore, a current path to the ground terminal Vss through the fuse F11 and first NAND gate 101 is established. As the amount of the current applied through the first PMOS transistor P11 is larger than that passed to the ground terminal Vss, the first node Q11 keeps the potential of the Low state. Furthermore, if a block is selected and the circuit is thus driven, however, as signals of a Low state are applied but the circuit is not driven, the NOR gate 102 outputs the block select signal B_Sel of a Low state when the select signal SEL is applied as a High state. The second NAND gate 103 that received the block select signal B_Sel of the Low state and the clock signal Clk keeps the High state regardless of the clock signal Clk. Accordingly, the first capacitor C11 and the second capacitor C12 do not perform charge operations and the block select signal B_Sel is at a Low state. Therefore, as the second node Q12 becomes 0V through the first NMOS transistor N11, the fifth~seventh NMOS transistors N15~N17 of the switching unit 13 are turned off. Meanwhile, the block select signal B_Sel applied as a Low state is inverted to a High state through the second inverter I12 and the eighth NMOS transistor N18 is then turned on by this potential. Therefore, the voltage V_GLS' is applied to the gate select line of a not-selected block.

If a block is selected, the address signals inputted through the first~third address input terminals ADx are applied as a High state. The first NAND gate 101 then logically combines those signals to output a signal of a Low state. Thereby, a current path to the ground terminal Vss through the fuse F11 and the first NAND gate 101 is established. As the amount of the current applied through the first PMOS transistor P11 is smaller than that passed to the ground terminal Vss, the first node Q11 keeps the potential of the Low state. If the potential of the first node Q11 that keeps a Low state and the select signal SEL applied as the Low state because the block are selected, the NOR gate 102 logically combines the potential of the first node Q11 and the select signal SEL to output the block select signal B_Sel of a High state. The second NAND gate 103 that received the block select signal B_Sel of the High state and the clock signal Clk receives an inverted signal of the clock signal Clk. This repeatedly charges and discharges the first capacitor C11 and the second capacitor C12 and thus makes the second node Q12 to have a potential higher than Vpp. Furthermore, as the second node Q12 keeps a given potential (Vpp+Vt) by means of the second NMOS transistor N12, the first NMOS transistor Nil is turned off. Therefore, the fifth~seventh NMOS transistors N15~N17 of the switching unit 13 are turned on, by the potential of the second node Q12, to apply a given voltage V_GSL to the gate select line GSL, a given voltage VWL to the word line WL, and a given voltage V_SSL to the source select line SSL, of the flash memory cell block 14. Meanwhile, the block select signal B_Sel applied as a High state is inverted into a Low state through the second inverter 112. As the eighth NMOS transistor N18 is then turned off by the potential of the Low state, the voltage V_GLS' is not applied to the gate select line of a not-selected block.

In the conventional block select circuit constructed and driven as above, the block select signal B_Sel must keep a Low state regardless of the address signal in order to permanently define any fail flash memory cell block as a fail block. For this, it is required that the fuse is physically disconnected so that the potential of the first node always keeps a High state. However, the process of physically disconnecting the fuse is possible in a wafer status but it is impossible in a package state. Due to this, it is impossible to define any fail block occurring in a subsequent test as a fail block physically.

SUMMARY OF THE INVENTION

Accordingly, the present invention is contrived to substantially obviate one or more problems due to limitations and disadvantages of the related art, and an object of the present invention is to provide a block select circuit in a flash memory device capable of selectively processing a fail block even after being packaged.

Another object of the present invention is to provide a block select circuit in a flash memory device capable of selectively processing a fail block even after being packaged, by programming or erasing a flash memory cell using it.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a block select circuit according to the present invention is characterized in that it comprises a select unit including a flash memory cell that is programmable and erasable by a given voltage condition, for outputting a block select signal depending on address signals and a state of the flash memory cell, a high-voltage pumping unit for outputting a signal to keep a given high voltage according to the block select signal and the clock signal, and a switching unit for applying a given bias to a gate select line, a word line and a source select line of a flash memory cell block according to the output signal of the high-voltage pumping unit.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
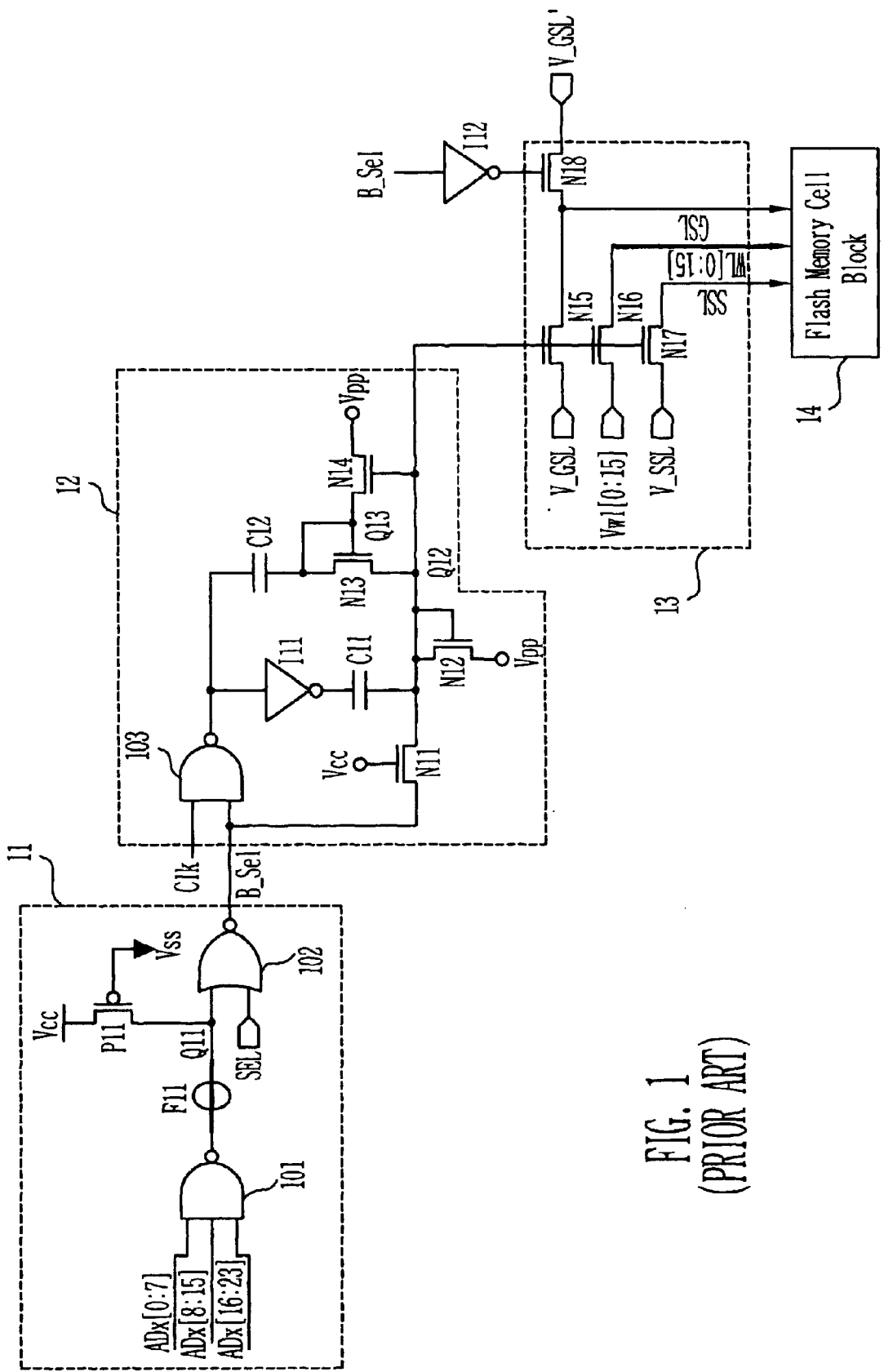
FIG. 1 is a conventional block select circuit in a flash memory device.

Reference will now be made in detail to the preferred embodiments of the present invention, examples of which are illustrated in the accompanying drawings, in which like reference numerals are used to identify the same or similar parts.

Figure 2:
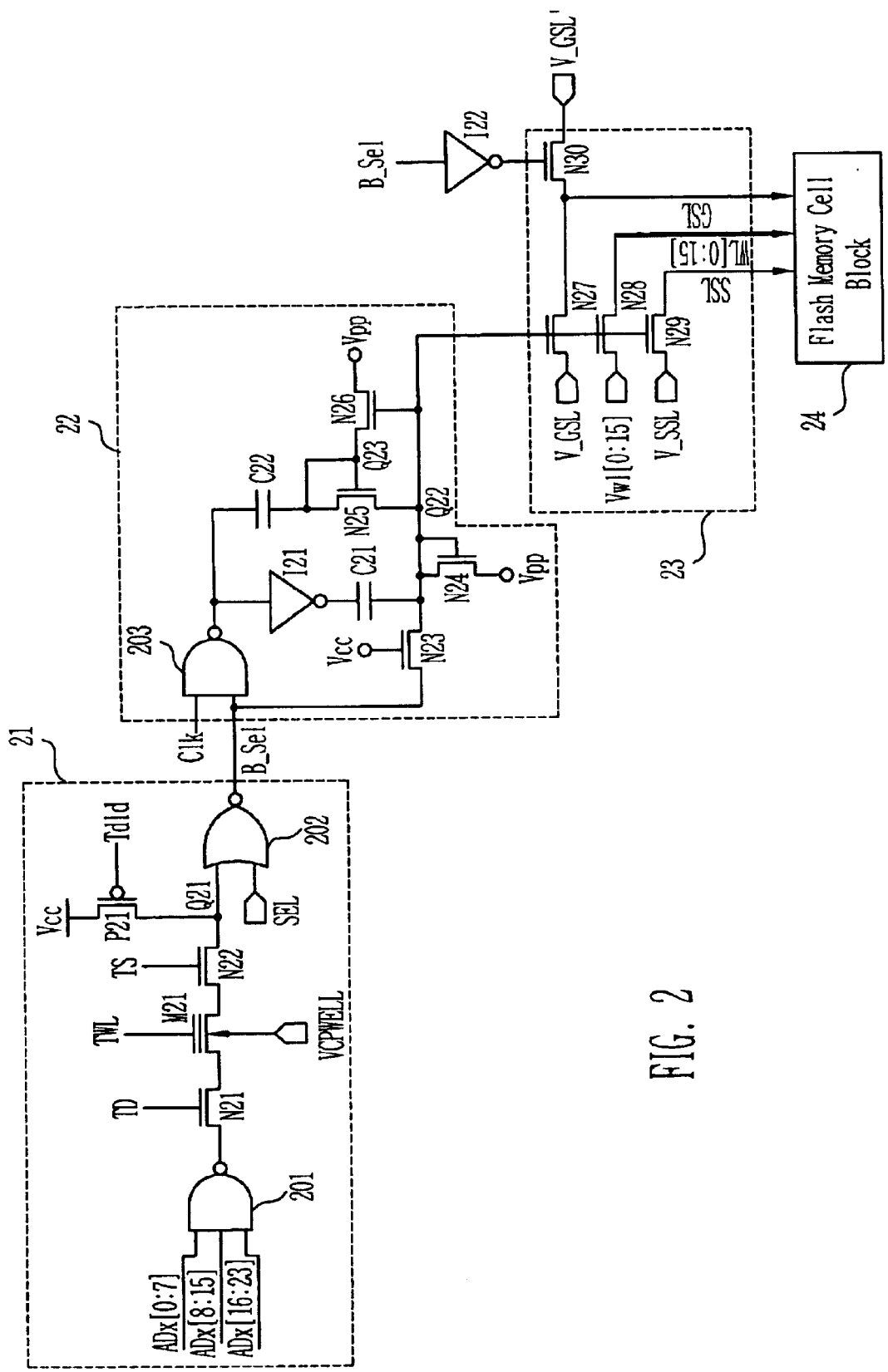
FIG. 2 is a block select circuit in a flash memory device according to a preferred embodiment of the present invention.

FIG. 2 is a block select circuit in a NAND type flash memory device according to a preferred embodiment of the present invention.

The block select circuit comprises a select unit 21, a high-voltage pumping unit 22 and a switching unit 23. The select unit 21 including a programmable and erasable flash memory cell M21, for outputting a block select signal B_Sel according to address signals, a select signal SEL and a status of the flash memory cell M21. The high-voltage pumping unit 22 for outputting a signal to keep a given high voltage according to the output signal of the select unit 21 and a clock signal. And, the switching unit 23 for applying a given bias to a gate select line GSL, a word line WL and a source select line SSL of a flash memory cell block 24 according to the output signal of the high-voltage pumping unit 22.

The construction of the select unit 21 will be described. A first NAND gate 201 logically combines 0~seventh address signals inputted through a first address input terminal ADx[0:7], eighth~fifteenth address signals inputted through a second address input terminal ADx[8:15], and sixteenth~twenty-third address signals inputted through a third address input terminal ADx[16:23]. A first NMOS transistor N21, a flash memory cell M21 and a second NMOS transistor N22 are connected between the output terminal of the first NAND gate 201 and a first node Q21. The first NMOS transistor N21 driven by a first control voltage TD controls the drain potential of the flash memory cell M21. Also, the second NMOS transistor N22 driven by a second control voltage TS controls the source potential of the flash memory cell M21. Furthermore, a third control voltage TWL is applied to the gate terminal of the flash memory cell M21 and a well voltage VCPWELL is applied to the well of the flash memory cell M21. Meanwhile, a first PMOS transistor P11 driven by a fourth control voltage Tdld is connected between the power supply terminal Vcc and the first node Q21. A NOR gate 202 logically combines the potential of the first node Q21 and the select signal SEL to output the block select signal B_Sel.

Next, the construction of the high-voltage pumping unit 22 will be described. A second NAND gate 203 logically combines the clock signal Clk and the block select signal B_Sel. A third NMOS transistor N23 driven by the power supply voltage Vcc is connected between the output terminal of the NOR gate 202 and a second node Q22. A first capacitor C21 that is charged according to the output of the first inverter 121 for inverting the output signal of the second NAND gate 203 is connected between the output terminal of the second NAND gate 203 and the second node Q22. A fourth NMOS transistor N24 driven according to the potential of the second node Q22 is connected between the second node Q22 and a pumping terminal Vpp. A sixth NMOS transistor N26 driven by the potential of the second node Q22 is connected between the pumping terminal Vpp and a third node Q23. A second capacitor C22 is connected between the output terminal of the second NAND gate 203 and the third node Q23. A fifth NMOS transistor N25 is connected between the third node Q23 and the second node Q22.

The construction of the switching unit 23 will be now described. A seventh NMOS transistor N27 supplies a given voltage V_GSL to the gate select line GSL of the flash memory cell block 24 according to the output signal of the high-voltage pumping unit 22. An eighth NMOS transistor N28 supplies a given voltage V_WL to the word line WL of the flash memory cell block 24 according to the output signal of the high-voltage pumping unit 22. Furthermore, a ninth NMOS transistor N29 supplies a given voltage V_SSL to the source select line SSL of the flash memory cell block 24 according to the output signal of the high-voltage pumping unit 22. Meanwhile, a tenth NMOS transistor N30 is driven according to the block select signal B_Sel that is inverted through a second inverter 122, to apply a given voltage V_GSL' to the gate select line GSL of the flash memory cell block 24 that is not selected.

A method of driving the block select circuit in the flash memory device constructed above according to the present invention will be below described.

The flash memory cell M21 of the select unit 21 is constructed to basically have an erase state.

In order to erase the flash memory cell M21, a voltage of 0V is applied to the first control voltage TD, the second control voltage TS and the third control voltage TWL, respectively, a given erase voltage is applied to the well voltage VCPWELL, and the power supply voltage Vcc is applied to the fourth control voltage Tdld.

Furthermore, in order not to apply a given bias to the flash memory cell block 24 by selecting a fail block, the flash memory cell M21 corresponding to the fail block is programmed. In order to program the flash memory cell M21, the power supply voltage Vcc is applied to the first control voltage TD, 0V is applied to the second control voltage TS, a given program voltage is applied to the third control voltage TWL, 0V is applied to the well voltage VCPWELL, and the power supply voltage Vcc is applied to the fourth control voltage Tdld. At this time, the address signal ADx and the select signal SEL are also applied.

Meanwhile, in order to read the status of this flash memory cell M21, the power supply voltage Vcc is applied to the first control voltage TD, the second control voltage TS and the third control voltage TWL, respectively, 0V is applied to the well voltage VCPWELL, and 0V is applied to the fourth control voltage Tdld. At this time, the address signal ADx and the select signal SEL are also applied.

A voltage application condition for programming, erasing and reading of the flash memory cell M21 is listed in Table 1 below.

TABLE 1

|  | Normal | Program | Erase |
| --- | --- | --- | --- |
| ADx | Adx | Adx | X |
| TS | Vcc | 0V | 0V |
| TD | Vcc | Vcc | 0V |
| Tdld | 0V | Vcc | Vcc |
| VCPWELL | 0V | 0V | Erase voltage |
| TWL | Vcc | Program voltage | 0V |
| SEL | SEL | SEL | X |

A driving method in case where the flash memory cell block 24 is not selected will be first described If the address signals inputted through the first~third address input terminals ADx are applied as a Low state, the first NAND gate 201 logically combines the signals to output a signal of a High state. However, if the flash memory cell M21 keeps an erase state, the output signal of the first NAND gate 201 that is kept as the High state is applied to the first node Q21 through the first NMOS transistor N21, the flash memory cell M21 and the second NMOS transistor N22, so that the first node Q21 keeps the High state. Due to the potential of the first node Q21 that keeps the High state and the select signal SEL applied as the High state because the block is not selected, the NOR gate 202 logically combines the potential of the first node Q21 and the select signal SEL output the block select signal B_Sel of a Low state.

Meanwhile, if the block is selected and the address signals applied through the first~third address input terminals ADx are applied as a High state, the first NAND gate 201 logically combines those signals to output a signal of a Low state. If the flash memory cell M21 keeps an erase state, however, a current path to the ground terminal Vss through the first NMOS transistor N21, the flash memory cell M21, the second NMOS transistor N22 and the first NAND gate 201 is established in the first node Q21. As the amount of the current applied through the first PMOS transistor P21 is smaller than that passed to the ground terminal Vss, the first node Q21 keeps a potential of a Low state. If the select signal SEL is applied as a High state, however, the NOR gate 202 outputs the block select signal B_Sel of a Low state. The select signal SEL is applied as a Los state when the block is selected and the circuit is driven but is applied as a High state otherwise.

Also, if the flash memory cell M21 keeps a program status regardless of the address signals inputted through the first~third address input terminals ADx, the flash memory cell M21 is turned off although the power supply voltage Vcc is applied to its gate terminal. The power supply voltage Vcc is thus supplied to the first node Q21 via the first PMOS transistor P21, so that the first node Q21 keeps a High state. As the first node Q21 keeps the High state, although the select signal SEL is applied as a High state or a Low state, the NOR gate 202 outputs the block select signal B_Sel of a Low state.

The second NAND gate 203 that receives the block select signal B_Sel of a Low state and the clock signal Clk outputs a signal of a High state regardless of the clock signal Clk. Therefore, as the first capacitor C21 and the second capacitor C22 do not a charge operation and the block select signal B_Sel is at a Low state, the second node Q22 becomes 0V via the first NMOS transistor N21 and the seventh~ninth NMOS transistors N27~N29 of the switching unit 23 are thus turned off. Meanwhile, the block select signal B_Sel applied as the Low state is inverted to a High state via the second inverter I22. The tenth NMOS transistor N30 is thus turned on by the inverted potential and the voltage V_GLS' is thus applied to the gate select line in a non-selected block.

A driving method in case where the flash memory cell block 24 is selected will be described.

If the block is selected and the address signals inputted from the first~third address input terminals ADx are applied as a High state, the first NAND gate 201 logically combines those signals to output a signal of a Low state. At this time, the flash memory cell M21 must keep an erased status. Thereby, a current path to the ground terminal Vss via the first NMOS transistor N21, the flash memory cell M21, the second NMOS transistor N22 and the first NAND gate 201 is established in the first node Q21. As the amount of the current applied through the first PMOS transistor P21 is smaller than that passed to the ground terminal Vss, the first node Q21 keeps a potential of a Low state. Due to the potential of the first node Q21 keeping the Low state and the select signal SEL applied as a Low state because the block is selected, the NOR gate 202 logically combines the potential of the first node Q21 and the select signal SEL outputs a signal of a High state. Further, the second NAND gate 203 that received block select signal B_Sel of the High state and the clock signal Clk outputs an inverted signal of the clock signal Clk. This enables the first capacitor C21 and the second capacitor C22 to repeatedly charge and discharge and thus makes the second node Q22 a potential higher than pumping voltage Vpp. Furthermore, as the second node Q22 keeps a given potential (Vpp+Vt) by means of the fourth NMOS transistor N24, the third NMOS transistor N23 is turned off. Therefore, the seventh~ninth NMOS transistors N27~N29 of the switching unit 23 are turned on, by the potential of the second node Q22, to apply a given voltage V_GSL to the gate select line GSL, a given voltage VWL to the word line WL and a given voltage V_SSL to the source select line SSL, of the flash memory cell block 24. Meanwhile, the block select signal B_Sel applied as the High state is inverted into a Low state via the second inverter 122 and the tenth NMOS transistor N30 is turned off by this potential. Thus, the voltage V_GLS' is not supplied to the gate select line in a not-selected block.

In the select circuit of the flash memory device constructed and driven as above, in case that a fail block occurred and a given voltage is not applied to a corresponding block, the flash memory cell M2 corresponding to that block is only programmed. Due to this, the first node Q21 keeps a High state regardless of the address signal. A fail block is not selected by the operation same to the case where the block is not selected.

As described above, a given voltage is not applied to a fail block by only the operation of programming the flash memory cell of an erase state. Therefore, the present invention has an advantageous effect that it can process a fail block even after being packaged.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A block select circuit in a flash memory device, comprising:
    a select unit including a flash memory cell that is programmable and erasable by a given voltage condition, for outputting a block select signal depending on address signals and a state of the flash memory cell;
    a high-voltage pumping unit for outputting a signal to keep a given high voltage according to the block select signal and the clock signal; and
    a switching unit for applying a given bias to a gate select line, a word line and a source select line of a flash memory cell block according to the output signal of the high-voltage pumping unit.

2. The block select circuit as claimed in claim 1, wherein the select unit comprises:
    a first logical means for logically combining the plurality of the address signals;
    a flash memory cell for performing a program, erase or read operation depending on a gate voltage and a well voltage;
    a first NMOS transistor connected between the first logical means and the drain terminal of the flash memory cell, for controlling the potential of the drain terminal of the flash memory cell;
    a PMOS transistor connected between the power supply terminal and an output terminal, for supplying the power supply voltage to the output terminal;
    a second NMOS transistor connected between the source terminal of the flash memory cell and the output terminal, for controlling the potential of the source terminal of the flash memory cell; and
    a second logical means for logically combining the potential of the output terminal and the select signal to output the block select signal.

3. The block select circuit as claimed in claim 2, wherein in order to erase the flash memory cell, 0V is applied to the gate terminal of the first NMOS transistor, the gate terminal of the second NMOS transistor and the gate terminal of the flash memory cell, respectively, an erase voltage is applied to the well of the flash memory cell, and the power supply voltage is applied to the gate terminal of the PMOS transistor.

4. The block select circuit as claimed in claim 2, wherein in order to program the flash memory cell, the power supply voltage is applied to the gate terminal of the first NMOS transistor, 0V is applied to the gate terminal of the second NMOS transistor, a given program voltage is applied to the gate terminal of the flash memory cell, 0V is applied to the well of the flash memory cell, and the power supply voltage is applied to the gate terminal of the PMOS transistor.

5. The block select circuit as claimed in claim 2, wherein in order to read the flash memory cell, the power supply voltage is applied to the gate terminal of the first NMOS transistor, the gate terminal of the second NMOS transistor and the gate terminal of the flash memory cell, respectively, 0V is applied to the well of the flash memory cell, and 0V is applied to the gate terminal of the PMOS transistor.

6. The block select circuit as claimed in claim 1, wherein the flash memory cell keeps an initial erase state, and where if any of the flash memory cell blocks is treated as a fail one, a flash memory cell to which an address corresponding to the flash memory cell block that will be treated as a fail one is applied, is programmed.

7. The block select circuit as claimed in claim 2, wherein the first logical means of a NAND gate.

8. The block select circuit as claimed in claim 2, wherein the second logical means is a NOR gate.

* * * * *